United States Patent [19]
von Recklinghausen

[11] 4,327,250
[45] Apr. 27, 1982

[54] DYNAMIC SPEAKER EQUALIZER
[75] Inventor: Daniel R. von Recklinghausen, Arlington, Mass.
[73] Assignee: Electro Audio Dynamics Inc., Great Neck, N.Y.
[21] Appl. No.: 35,496
[22] Filed: May 3, 1979
[51] Int. Cl.³ .............................................. H04R 3/00
[52] U.S. Cl. ...................................... 179/1 F; 330/85
[58] Field of Search .................... 179/1 F, 1 VL, 184; 330/85, 86

[56] References Cited
U.S. PATENT DOCUMENTS

| | | | |
|---|---|---|---|
| 3,334,184 | 8/1967 | DeKoning | 179/1 F |
| 3,449,518 | 6/1969 | Erath | 179/1 F |
| 3,821,473 | 6/1974 | Mullins | 179/1 F |
| 3,889,060 | 6/1975 | Goto et al. | 179/1 F |
| 3,937,887 | 2/1976 | Miller | 179/1 F |
| 4,163,119 | 7/1979 | Baba et al. | 179/1 F |

FOREIGN PATENT DOCUMENTS

| | | | |
|---|---|---|---|
| 1299328 | 7/1969 | Fed. Rep. of Germany | 179/1 F |
| 1520156 | 8/1978 | United Kingdom | 179/1 F |

*Primary Examiner*—Thomas W. Brown
*Attorney, Agent, or Firm*—Holland, Armstrong, Wilkie & Previto

[57] ABSTRACT

A dynamic equalizer circuit is disclosed for the driver system of an electro-mechanical transducer such as a loudspeaker. The circuit provides an improved or leveled audio output and includes a protective arrangement which protects the transducer against damage from being overdriven. The protective arrangement includes a sensor which produces a continuous protective control signal based upon operating characteristics of the transducer such as transducer motion or temperature or fatigue.

8 Claims, 8 Drawing Figures

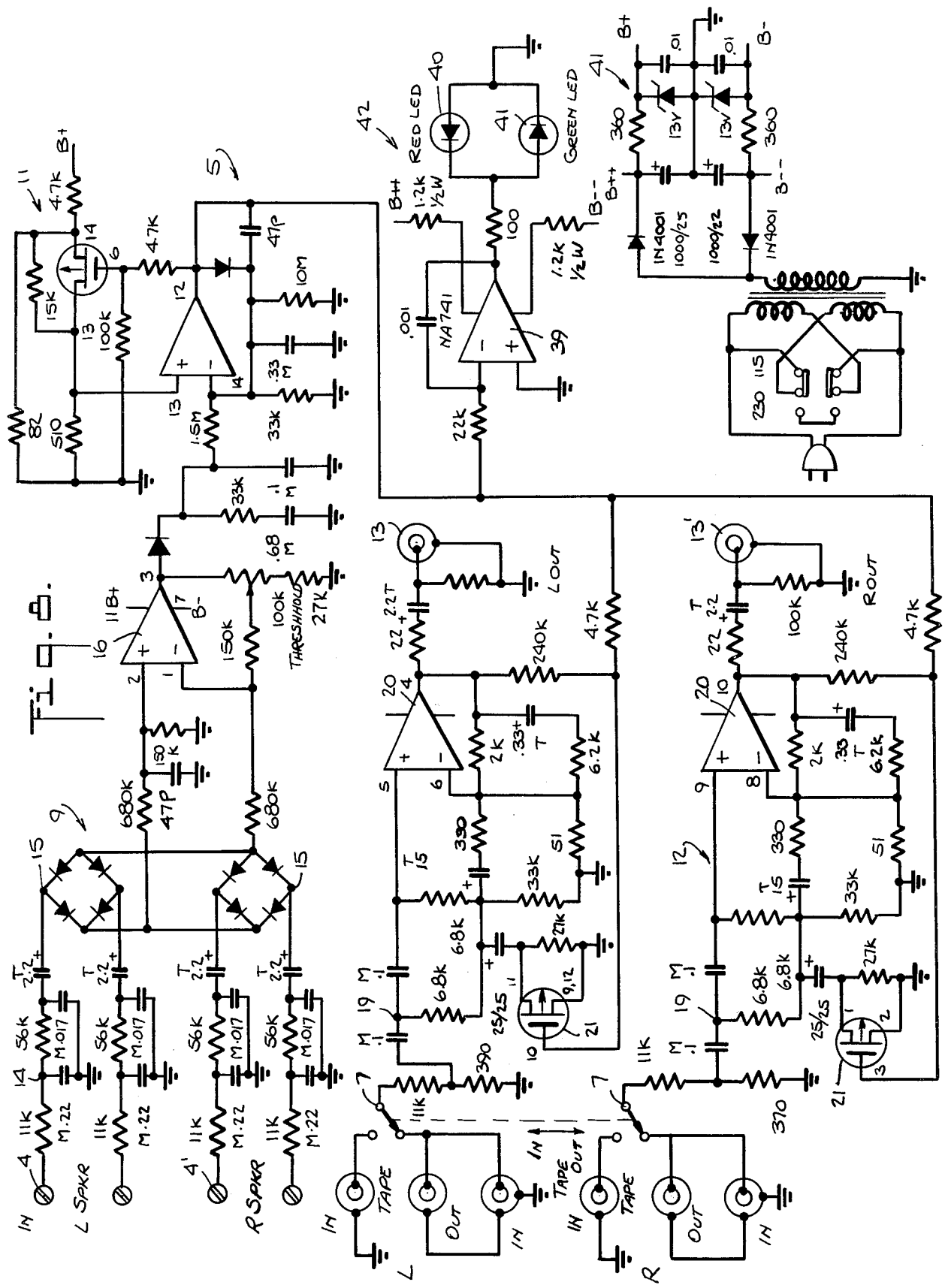

DYNAMIC SPEAKER EQUALIZER

BACKGROUND OF THE INVENTION

The present invention relates to electro-dynamic transducers such as loudspeakers and in particular to a dynamic equalizer for providing an improved or relatively level transducer output and for simultaneously protecting the transducer against damage through excessive motion or temperatures or fatigue from being overdriven.

There are known transducer driving systems employing one form or another of electric equalization including special amplifiers or feed-back systems which however, have not permitted the systems to achieve their maximum potential in providing a generally level signal output and in obtaining maximum volume for a transducer of a given size without the risk of transducer damage.

The system of the present invention is based upon a recognition that for a level output maximum transducer deflection is required at the low frequency end of the driving signal. It provides for a boost of the low frequency portion of the signal while at the same time providing for a dynamic and frequency sensitive protective means for operating the transducer below destructive levels either for mechanical movement, or temperature, or through fatigue after extended transducer use.

For example, exceeding maximum loudspeaker cone travel results in severe acoustic harmonic distortion at low frequencies as well as very audible intermodulation distortion between the low frequencies and the other higher frequency music waveforms. This problem is avoided in the dynamic equalizer which senses an electrical replica or other sampling of cone travel and reduces the low frequency response of the equalizer when a predetermined peak-inward or peak-outward cone travel is exceeded. Therefore, the loudspeaker system reproduces the electric signals as acoustic signals, reducing the frequency response whenever excessive levels are encountered and distortion and damage are avoided.

The equalizer circuit is designed to be connected between a preamplifier output and the power amplifier input or the tape-monitor circuit of a typical receiver of amplifier. Additionally, the circuit acts as a connection between the loudspeaker output terminals of the power amplifier circuit and the loudspeakers. This connection provides signals for the cone-displacement sensing circuit with the internal circuit permitting both single-ended and bridging mode power amplifier circuits without any other modifications.

The dynamic equalizer may provide two channels of unity gain at mid and high audio frequencies and provides a boost at low frequencies to equalize the frequency response of the loudspeakers. At signal levels below a threshold, a low frequency cutoff of about 40 Hz protects the loudspeakers against sub-sonic and other low frequencies. Beyond threshold, the cutoff or high-pass frequency increases with increasing signal while the low-frequency boost above cutoff is simultaneously reduced. By this means overall flatness of frequency response is maintained with only the low frequency limit increased.

Accordingly, an object of the present invention is to provide an improved system for driving electro-dynamic transducers or speakers.

Another object of the present invention is to provide an improved driving system for speakers providing a generally level audio output.

Another object of the present invention is to provide a speaker driving system which protects the driven speakers against damage from excess signal input particularly at low frequencies.

Another object of the present invention is to provide a relatively simple and inexpensive and reliable system for equalizing the audio output of speakers.

Other and further objects of the present invention will become apparent upon an understanding of the illustrative embodiments about to be described or will be indicated in the appended claims, and various advantages not referred to herein will occur to one skilled in the art upon employment of the invention in practice.

BRIEF DESCRIPTION OF THE DRAWINGS

A preferred embodiment of the invention has been chosen for purposes of illustration and description and is shown in the accompanying drawing, forming a part of the specification, wherein:

FIG. 8 is a schematic diagram of a preferred embodiment of the dynamic speaker equalizer in accordance with the present invention.

DESCRIPTION OF THE PREFERRED EMBODIMENT

Figure 1:
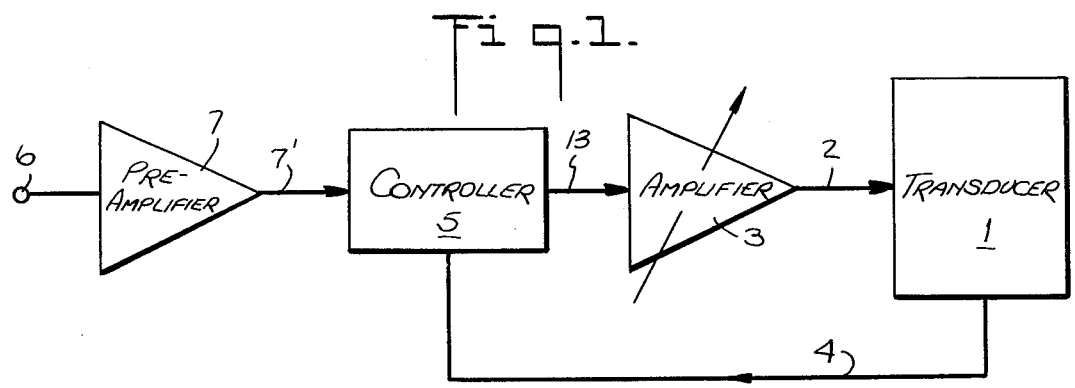
FIG. 1 is a block diagram illustrating a preferred embodiment of a dynamic speaker equalizer in accordance with the present invention in a transducer driving system.

The circuit will first be described generally with particular reference to the block diagram FIG. 1. In FIG. 1, the electro-dynamic transducer or loudspeaker is illustrated at 1 and may comprise a single loudspeaker or a pair of stereo loudspeakers being driven at input 2, which in the case of a pair of speakers, would comprise two inputs from a dual channel adjustable amplifier 3. An output 4 is shown coupling the transducer 1 to a controller or speaker equalizer 5 in accordance with the present invention. The control signal on the output 4 is a monitoring signal for the purpose of causing the controller 5 to protect the transducer 1 against damage from being physically over driven or over-heated or subjected to excessive fatigue, etc.

Figure 2:
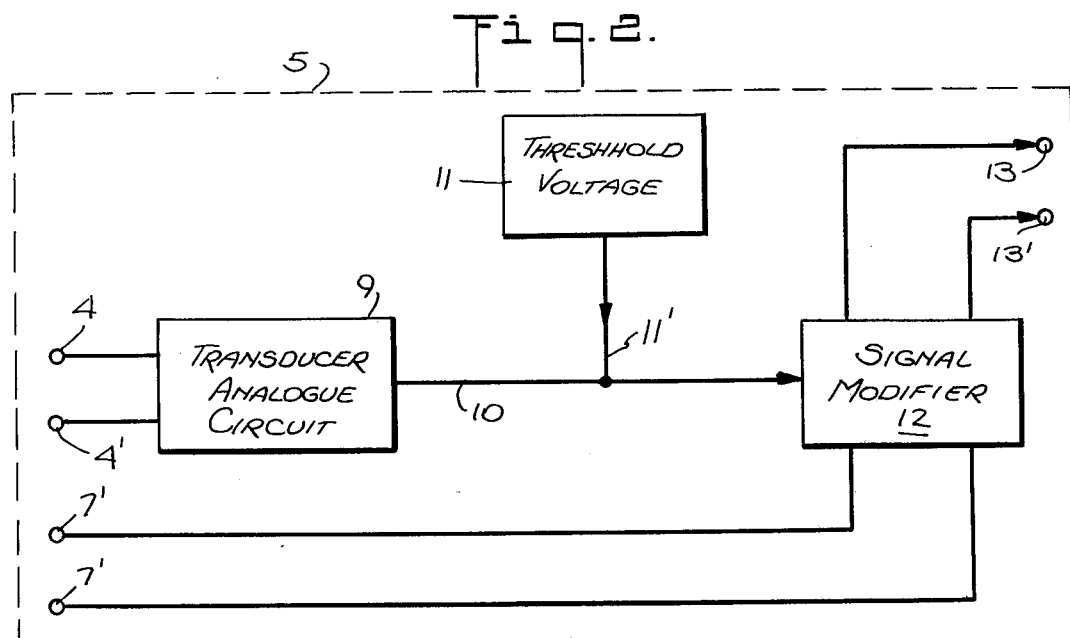
FIG. 2 is a block diagram of a preferred embodiment of the dynamic speaker equalizer in accordance with the present invention.

A number of means for generating the control signal on the transducer output 4 will be described below. The first control signal which will be described with reference to a preferred embodiment of the controller 5 as illustrated in FIGS. 2 and 8 may be a direct coupling of the signal on the transducer input 2 back to the controller 5. In this case, the control signal is directly proportional to the amplifier 3 output signal which is driving the transducer 1. In FIG. 1, the signal being fed from a record turntable or tuner or other signal source at input 6 is being coupled through a conventional preamplifier 7 to the controller 5. In accordance with the invention, the controller 5 has a dual action. In the first place, it includes an adjustable frequency and gain high-pass filter which acts to equalize the transducer response over the desired frequency range, in effect providing an augmented low frequency response and additionally having an automatic signal power limiting control for limiting the transducer movement at the critical lower frequency end for protecting a transducer element such as a loudspeaker cone against physical damage caused by excess movement.

In the preferred embodiment of the controller 5, which will now be described with particular reference to FIGS. 2 through 6 and 8, the control signal on the transducer monitor output 4 is fed into an analog circuit 9 within the controller 5. The analog circuit 9 output on output 10 is a voltage analogous to the transducer motion. This is fed to the signal modifier circuits 12 within the controller 5 to limit the controller 5 output signal on output 13 to signals at or below the critical damaging level thereby providing protection for the transducer 1 so that it is not overdriven.

FIG. 2 is a simplified block diagram illustrating the controller 5, as referred to above in the discussion of FIG. 1. The controller 5 is the circuit which produces a signal modification on the basis of the transducer cone motion or other monitored cone characteristics to control the signal fed through the amplifier 3 to the transducer 1. The control signal, or signals from the transducer output 4 in the case of a stereo system, are fed into the transducer analog circuit 9 in the controller 5. This circuit is designed to provide an output signal analagous to the transducer characteristics being monitored as, for example, cone displacement. The analog is based upon the signal action for a conventional equivalent circuit for a dynamic loudspeaker. The analog circuit output 10 is compared with the output 11' of a predetermined threshhold voltage 11 to set the maximum desirable cone motion. The combined outputs of 10 and 11 are fed into a signal modifier circuit 12 set to have a controlled output 13 and 13' below the preset maximum value. The modified signals on the ouputs 13 and 13' are passed through the adjustable amplifier 3 to the transducer 1.

Figure 3:
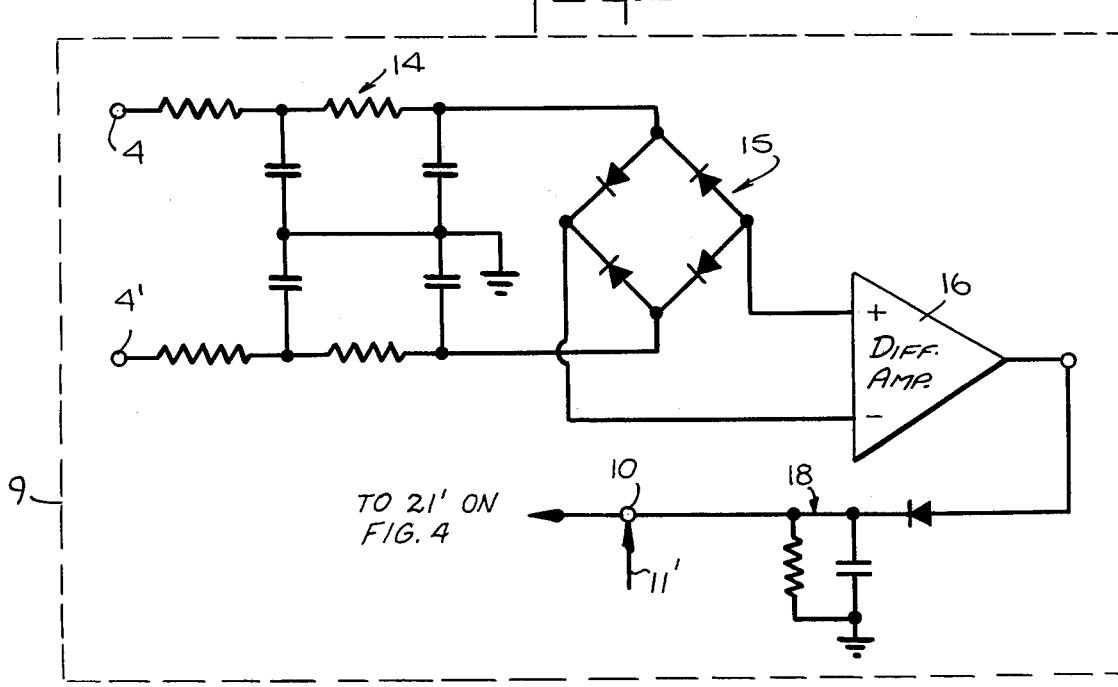
FIG. 3 is a schematic diagram of a preferred embodiment of an analog circuit for producing a protective control signal for the transducer in accordance with the present invention.
Figure 4:
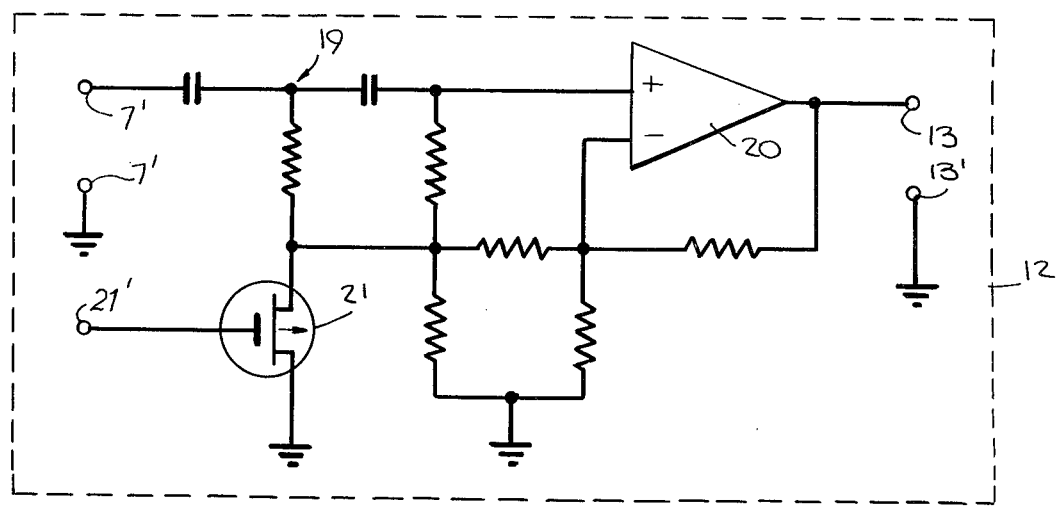
FIG. 4 is a schematic diagram of a preferred embodiment of a signal modifier for use in the dynamic speaker equalizer in accordance with the present invention.

FIG. 3 is a simplified schematic diagram of the analog circuit 9 as referred to in the above discussion of FIG. 2. The control signals at 4 and 4' from the transducer 1 are fed through double integrators 14 and a rectifier 15 as an input to a differential amplifier 16. The output of the differential amplifier 16 is combined with the predetermined threshhold or control voltage 11 to generate a control signal at terminal 17 of the output storage circuit 18.

The control signal at output 17 is fed to a signal modifier circuit 12 for providing the above discussed filtering and signal strength limitation action. The signal modifier 12 is illustrated in simple diagrammatic form in FIG. 4. The input signals from the preamplifier 7 is fed through a high pass filter 19. An input 21' of an FET 21 in the filter circuit is under the control of the control signal or analog output 17 for limiting or cutting off the low frequency signals on outputs 13 and 13' to the amplifier 3 at the predetermined protective value for the transducer 1. The combination of the high pass filter 19 and the protective action of the FET 21 produces a relatively flat frequency output from about 30 to 4,000 cycles per second as illustrated in the typical response curves illustrated in FIG. 5 with the several curves representing increasing values of the control voltage signals 17.

Figure 6:
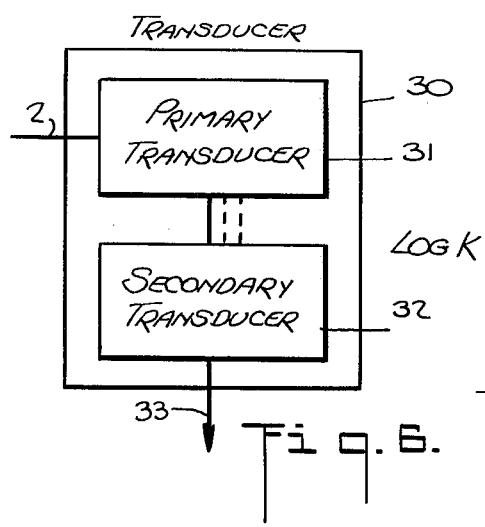
FIG. 6 is a block diagram illustrating another embodiment of a sensing means for the dynamic speaker equalizer in accordance with the present invention.
Figure 5:
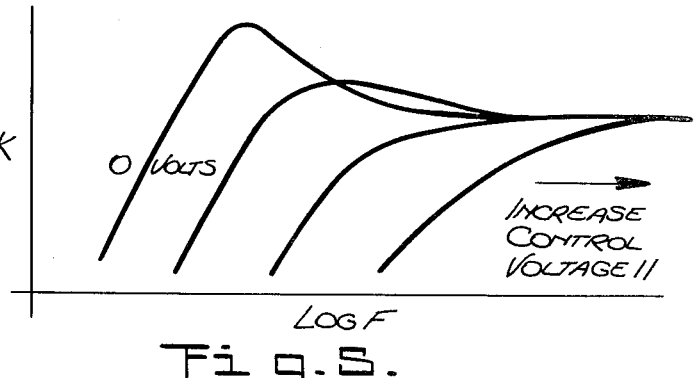
FIG. 5 is a graph illustrating frequency responses of the transducer operated with a dynamic speaker equalizer in accordance with the present invention.

FIG. 6 is a block diagram of another embodiment of means for producing the control signal in place of the above described analog control signal. The transducer 30 includes the primary transducer element 31 such as a cone or other acoustic signal generating member and a secondary transducer 32. The secondary transducer is a sensing device for generating an electrical signal proportional to movement, or temperature, or fatigue for the primary transducer of 31. The transducer 32, for example, may be an electro-mechanical gauge generating an electrical signal proportional to primary transducer 31 motion or a thermal electric device generating a signal proportional to the transducer 31 temperature or a similar sensing device capable of producing a control signal 33 which may be fed back to a control such as the controller 5 and where the signal may bypass the integrator 14 and the rectifier 15 for connection to an input for a differential amplifier 16 with or without a suitable level adjusting circuit or means.

Figure 7:
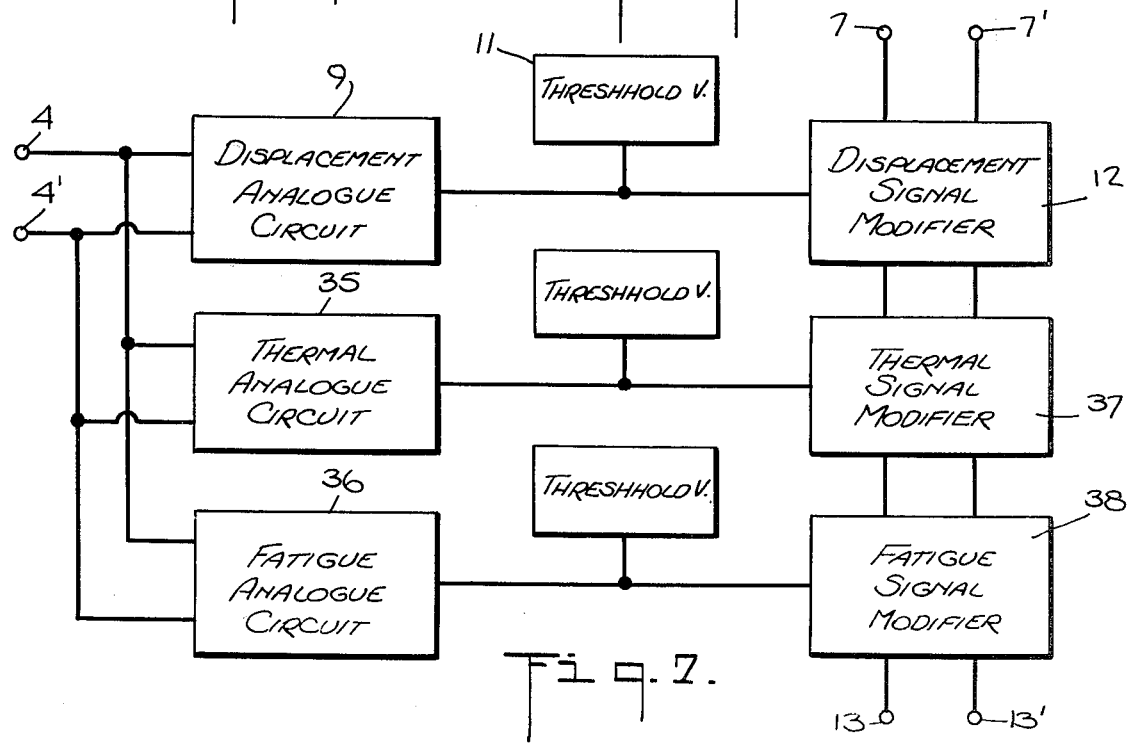
FIG. 7 is a block diagram illustrating a still further embodiment of a sensing means for the dynamic speaker equalizer in accordance with the present invention.

FIG. 7 illustrates another system including the use of several analog means operating simultaneously in an equalizer or protective circuit. For example, FIG. 7 illustrates a first circuit based on an analog means 9 as descrbed above operating in parallel with an additional thermal analog protective circuit 35 and a fatigue protecting analog circuit 36. In general, the additional circuits 35 and 36 are similar except that the control signals used in place of the analog output 10 for controlling the signal modifiers differ to control the temperature and fatigue characteristics in modifiers 37 and 38. The thermal analog circuit 35, for example, would comprise a thermal electric analog generating a control signal proportional to the temperature of the transducer being protected. The fatigue analog circuit would include an analog for generating an electrical signal proportional to mechanical acceleration, velocity, or displacement depending upon the particular transducer element being protected. In the circuit illustrated in FIG. 7, the three modifying circuits are connected in series so that they would provide a normal signal pass-through in the absence of a control signal at one of the three control signal sensing means indicating that a signal modification was required.

FIG. 8 is a more detailed circuit diagram of a preferred embodiment of a controller or equalizer circuit 5 based upon the use of a displacement analog circuit as described above in connection with the description of FIG. 1. This circuit indicates representative components with certain values indicated and illustrates other standard components as needed for an adequate description of this circuit. The analog circuit 9 is shown at the upper left hand corner with its outputs or control voltage being determined at threshold circuit 11 and with the combined control voltage from these sections of the controllers being fed to a pair of FET's 21 in the similar signal modifier circuits 12. A suitable power supply circuit 41 is illustrated in the lower right hand corner for providing a B+ and the B− voltages and above that an indicator system 42 is illustrated in which a differential amplifier 39 is adjusted for energizing a red LED 40 when the control voltage exceeds its predetermined value to initiate protective action in the modifier circuits and with a green LED 41 set for indicating normal safe operating levels.

It will be seen that an improved circuit has been provided for driving electro dynamic transducers such as stereo or other loudspeaker systems. The improved circuit provides for both a more level output and, at the same time, protects the transducers against damage such as may be caused by physically overdriving the transducers or by overheating them or by driving them in such a manner that they are damaged by fatigue. A dynamic equalizer circuit is provided which is easily inserted into an otherwise conventional transducer driving circuit or used in new systems as it may be provided in a physically compact form using a minimal amount of energy.

In one preferred form of the dynamic equalizer, the sensing means is based upon an analog signal derived from the driving signal which permits the dynamic equalizer circuit to be used without requiring the addition of other sensing means to the transducer for the several protective modes discussed above. This makes the new system particularly useful with existing transducers including otherwise conventional stereo systems.

As various changes may be made in the form, construction and arrangement of the parts herein without departing from the spirit and scope of the invention and without sacrificing any of its advantages, it is to be understood that all matter herein is to be interpreted as illustrative and not in a limiting sense.

Having thus described my invention, I claim:

1. Means for protecting an electro-dynamic transducer comprising the combination of sensing means for forming a control signal representative of an operation characteristic of the transducer, signal modifying means coupled in the transducer driving signal input including means for modifying the transducer input signal in accordance with the said control signal,
    said sensing means comprising an analog circuit forming a signal based upon the operational condition of the driven transducer and including integrator means coupled to a differential amplifier and means applying a predetermined threshold voltage to the amplifier, and
    said signal modifying means including a high pass filter coupled to the driving signal and a FET coupled between the high pass filter and the output of the said differential amplifier.

2. Means for protecting an electro-dynamic transducer comprising the combination of sensing means for forming a control signal representative of an operating characteristic of the transducer, signal modifying means coupled in the transducer driving input including means for modifying the transducer input signal in accordance with the said control signal,
    said sensing means comprising an analog circuit forming a signal based upon the operational condition of the driven transducer, and
    said signal modifying means including a differential amplifier and a high pass filter coupled to the driving signal and means for limiting low frequency signals coupled between the high pass filter and the output of the said differential amplifier.

3. The means as claimed in claim 1 in which the analog circuit comprises means for forming a signal based on transducer motion.

4. The means as claimed in depending claim 2 in which the analog circuit comprises means for forming a signal based on transducer motion.

5. The means as claimed in claim 1 in which said transducer comprises a loudspeaker including a driven cone and the analog circuit comprises means for forming a signal based on cone movement.

6. The means as claimed in depending claim 2 in which said transducer comprises a loudspeaker including a driven cone and the analog circuit comprises means for forming a signal based on cone movement.

7. The means as claimed in claim 1 in which said sensing means comprises an electro-mechanical sensor for detecting transducer motion.

8. The means as claimed in depending claim 2 in which said sensing means comprises an electro-mechanical sensor for detecting transducer motion.

* * * * *